(12) United States Patent
Letas

(10) Patent No.: US 9,121,882 B2
(45) Date of Patent: Sep. 1, 2015

(54) WIND ENERGY PLANT TESTING DEVICE

(75) Inventor: Heinz-Hermann Letas, Suesel (DE)

(73) Assignee: SENVION SE, Hamburg (DE)

( * ) Notice: Subject to any disclaimer, the term of this patent is extended or adjusted under 35 U.S.C. 154(b) by 521 days.

(21) Appl. No.: 13/121,609

(22) PCT Filed: Sep. 30, 2009

(86) PCT No.: PCT/EP2009/007028
§ 371 (c)(1),
(2), (4) Date: Mar. 29, 2011

(87) PCT Pub. No.: WO2010/037537
PCT Pub. Date: Apr. 8, 2010

(65) Prior Publication Data
US 2011/0175620 A1    Jul. 21, 2011

(30) Foreign Application Priority Data

Sep. 30, 2008    (DE) .................... 10 2008 049 629

(51) Int. Cl.
| G01R 31/00 | (2006.01) |
| G01R 31/02 | (2006.01) |
| G01R 31/34 | (2006.01) |
| F03D 11/00 | (2006.01) |
| H02J 3/38  | (2006.01) |

(52) U.S. Cl.
CPC ............ *G01R 31/02* (2013.01); *F03D 11/0091* (2013.01); *G01R 31/343* (2013.01); *H02J 3/386* (2013.01); *Y02E 10/763* (2013.01)

(58) Field of Classification Search
None
See application file for complete search history.

(56) References Cited

U.S. PATENT DOCUMENTS

| 5,886,429 A      | 3/1999  | Grady et al.              |
| 6,285,169 B1 *   | 9/2001  | McEachern ............ 323/209 |
| 6,490,143 B1     | 12/2002 | Estrela et al.            |
| 7,218,122 B1 *   | 5/2007  | Nastasi et al. ............ 324/620 |
| 2009/0115254 A1* | 5/2009  | Dawley ................ 307/103 |

FOREIGN PATENT DOCUMENTS

| DE | 1 591 837 | 2/1970 |
| EP | 1 876 460 | 1/2008 |

OTHER PUBLICATIONS

International Search Report mailed on Feb. 1, 2010, directed to counterpart International Application No. PCT/EP2009/007028; 10 pages.

* cited by examiner

*Primary Examiner* — Melissa Koval
*Assistant Examiner* — Stephen G Armstrong
(74) *Attorney, Agent, or Firm* — Morrison & Foerster LLP

(57) ABSTRACT

A wind energy installation test device for defined production of grid system faults, and a method thereof. The test device can include an output configured to connect to a wind energy installation, an input configured to connect to a grid system, and a switching device for connection of an electrical disturbance component relating to a grid system parameter. An autotransformer can be used for the electrical disturbance component. The grid system in a sound state can be connected to a primary winding connection and the grid system in a disturbed state with respect to the grid system parameter can be output at a secondary winding connection.

18 Claims, 4 Drawing Sheets

WIND ENERGY PLANT TESTING DEVICE

REFERENCE TO RELATED APPLICATIONS

This application is a national stage application under 35 USC 371 of International Application No. PCT/EP2009/007028, filed Sep. 30, 2009, which claims the priority of German Patent Application No. 10 2008 049 629.4, filed Sep. 30, 2008, the contents of which prior applications are incorporated herein by reference.

FIELD OF THE INVENTION

The invention relates to a test device for wind energy installations. The test device has an output and an input, wherein the wind energy installation is connected to the output and wherein a grid system can be connected to the input, and a switching device is provided for connection of an electrical disturbance component relating to a grid system parameter.

BACKGROUND OF THE INVENTION

With the increasingly widespread use of wind energy installations, these installations have to satisfy more stringent requirements relating to their behavior with respect to the grid system. This is particularly true for those wind energy installation which are intended for connection to a medium-voltage grid system. The grid system connection conditions to be complied with are referred to as "grid codes" of the respective grid system operator. These requirements include, for example, the behavior of the wind energy installations, when a sudden voltage change occurs in the grid system voltage. This requirement, which is also referred to as "voltage ride through", states that wind energy installations should not be disconnected immediately when a voltage error is present in the grid system, but should remain connected to the grid system at least for a specific time (normally about 150 ms), and should then either feed electrical power into the grid system again as quickly as possible after the grid system voltage returns or should be involved in feeding reactive power for the duration of the grid system error, in order to support the grid system, particularly with respect to the grid system voltage.

In order to verify this required characteristic of the wind energy installations with respect to compliance with the requirements of the grid system operator, test devices are provided. These are based on the knowledge that appropriate measurements are not actually practical on the real public grid system. The test devices are used to simulate appropriate voltage errors in a defined manner, and to allow the behavior of the wind energy installation to be checked. Devices such as these for voltage testing of wind energy installations are known. For example, the disturbance resulting from a grid system undervoltage is simulated by connection of inductors.

EP 1 876 460 A1 discloses a test device which can be connected between a wind energy installation to be tested and the grid system. This has an integrated transformer and a plurality of impedances, which are connected in a matrix form and can be included in the circuit via switches. The device can be used to simulate various faults, such as single-phase or multi-phase shorts between phases or to ground. In this case, the duration and the depth of a voltage dip can be adjusted, but not completely independently of one another.

SUMMARY OF THE INVENTION

The present invention is based on the object of improving a test device of the type mentioned initially such that it can be adjusted more freely in order to also test for grid system faults other than shorts.

The solution according to the invention comprises the features broadly disclosed herein. Advantageous developments are set forth in the disclosure.

In the case of a wind energy installation test device for defined production of grid system faults having an output, to which a wind energy installation to be tested can be connected, and having an input for connection of a grid system, wherein a switching device is provided for connection of an electrical disturbance component relating to a grid system parameter, the invention provides that an autotransformer is used for the electrical disturbance component, with the sound grid system being connected to a primary winding connection and with a grid system which has been disturbed with respect to the grid system parameter being output at a secondary winding connection.

A number of the terms used will first of all be explained in the following text:

A grid system parameter means an electrical variable of the grid system, such as the voltage, the frequency or the phase. A variable is typically used which generally changes in the event of a grid system disturbance, in particular the grid system voltage or the grid system phase.

A disturbed grid system means an abnormal state of the grid system, which has negative effects on the grid system reliability and must be overcome by remedial measures.

An autotransformer means an arrangement in which the primary winding at the same time also forms a part of the secondary winding. There is therefore no galvanic isolation between the primary winding and the secondary winding. The above definition means that the secondary winding is that which has a greater number of turns specifically the number of turns of the primary winding and of an additional winding part; the primary winding conversely forms a part of the secondary winding and therefore also has only a fraction of the numbers of turns of the secondary winding. In simple terms, the secondary winding is that with the greater number of turns.

A connection of the primary winding means that connection which, together with a common foot point, forms a connection pair for the primary winding.

A secondary winding connection means the connection which, together with the common foot point, forms a second connection pair for the secondary winding.

The invention is based on the discovery that only a small number of conventional components from electrical power engineering, specifically switches, transformers and possibly inductors, need be used to produce a test device in a simple manner, which can also be used for voltage peaks and when sudden phase changes occur. An autotransformer which is known per se is used in the test device according to the invention in such a way that it can also be used to produce a higher voltage. This surprisingly simple trick means that voltage peaks can also be produced for testing. This therefore allows the test program for the wind energy installations to be extended in a simple manner using conventional components.

It should be noted that the use of autotransformers has already been proposed for test devices. However, they have been used only to produce lower voltages.

The invention has identified that the autotransformer can also be operated, with suitable switching, such that it can be used as an electrical disturbance component to produce a voltage peak.

The autotransformer provided according to the invention offers the further advantage that it can be combined with a phase-displacement coil (combined autotransformer/phase-displacement transformer). This combination means that a phase shift can also be produced. This also allows grid system disturbances relating to the phase to be combined in a simple manner. It should be noted that the configuration of the winding ratios in the autotransformer can also be used to ensure that no voltage change occurs, but the phase is simply shifted. In this case, in a more advantageous arrangement, the additional phase-displacement coil can be arranged to be switchable for the phase. Depending on the switch position, this therefore additionally allows a sudden phase change to be applied as a further grid system disturbance, or this can be done at the same time as a sudden voltage change.

The autotransformer is preferably designed such that it has a plurality of taps for the secondary voltage connection. This makes it possible to produce different sudden voltage change levels. In a corresponding manner, it is also possible for the phase-displacement coil for the autotransformer to have a plurality of taps. This also makes it possible to produce different sudden phase changes.

A combined autotransformer/phase-displacement transformer having coil pairs which are arranged such that the phases can be displaced alternately is preferably provided connected in delta. In this case "such that the phases can be displaced alternately" means that the electrical angles included by the respective coil pairs are different. In this case, the electrical angle means the angle defined from the numbers of turns, using the cosine rule. The precise calculation is specified in more detail in the following text, in the description relating to the figures. This preferred embodiment offers the advantage that it allows not only testing for overvoltage but also in addition testing for a sudden phase change with a single component, with this even being for all the phases.

It has been found that a particularly advantageous arrangement is obtained by designing the autotransformer/phase-displacement transformer for an angle of 53°. This means that the electrical angles are alternately 53° and 67°, thus resulting in a total of 360° across three phases. It should be noted that other phase-displacement angles, which are intrinsically as required, can also be produced by varying or adapting the numbers of turns.

A multi-switching unit is advantageously provided for the phase-displacement transformer. This multi-switching unit is designed such that the same autotransformer can be switched to a second connection variant, in which it used to produce an undervoltage. This makes it possible to use one and the same autotransformer to test not only for voltage peaks but also for undervoltage. It is also possible for the autotransformer to have a plurality of parallel transformers, which can be connected independently. The individual transformers can thus be designed for different functions, such that they can be activated as required.

The switches of the switching device and if appropriate of the multi-switching unit are advantageously in the form of double switches. This offers the advantage of a short switching time. If very short switching times are desirable, then the switches may also be in the form of electronic switches. This offer the further advantage that this results in good wear resistance and therefore in a long life, even for a large number of switching cycles.

One particularly advantageous embodiment of the invention allows an inverter to be provided in the electrical disturbance component. Freely selectable grid system disturbances can therefore be applied by appropriate operation of the inverter. A transformer is then no longer absolutely essential and, if required, can be replaced by the inverter.

BRIEF DESCRIPTION OF THE DRAWINGS

The invention will be explained in more detail in the following text with reference to the attached drawings, which illustrate an advantageous exemplary embodiment, and in which.

DETAILED DESCRIPTION OF THE INVENTION

Figure 1:
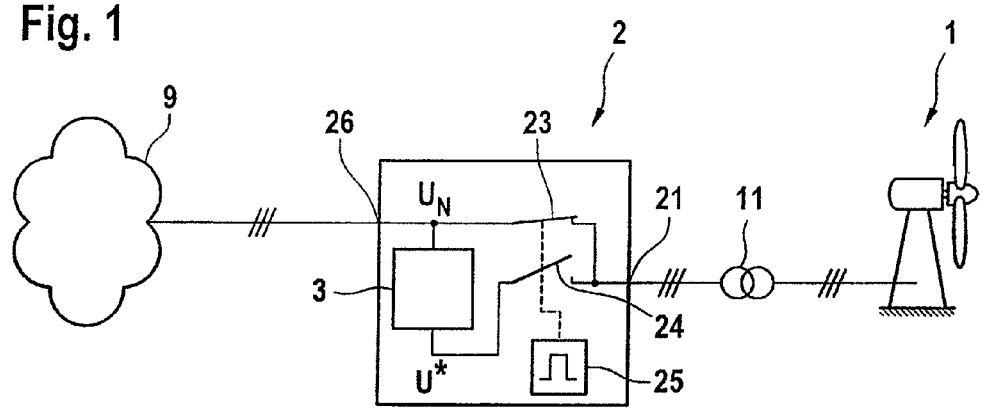
FIG. 1 shows a schematic view of a wind energy installation having a first embodiment of a test device.

Test devices according to the present invention are used to test the behavior of a wind energy installation 1 on the electrical grid system. An actually existing public electricity grid system 9 can be used as the electricity grid system, or it is possible to use one or more voltage sources 9', which simulate the electrical grid system.

The test device, which is annotated in its totality with the reference number 2 or 2', is respectively connected between the wind energy installation 1 and the electrical grid system 9, or the voltage source 9' which acts as a substitute for it. In this case, the transformer 11, which is generally in the form of a medium-voltage trans-former of the wind energy installation 1, is normally connected between the test device 2 and the wind energy installation 1. This applies in any case to a wind energy installation 1 with a doubly-fed asynchronous generator. In other embodiments, the test device may if required be connected between the wind energy installation 1 and the transformer 11.

The basic design will be explained using the example of the first embodiment illustrated in FIG. 1. The wind energy installation 1 is connected via a transformer 11 to one output 21 of the test device 2. A first switch 23 and a second switch 24 are connected to the output 21. The two switches are controlled by a switching module 25. Depending on an operating signal which is output from the switching module 25, the two switches 23, 24 are in a first position, in which the first switch 23 is closed and the second switch 24 is open (illustrated in FIG. 1), or in a second position, in which the first switch 23 is open and the second switch 24 is closed. In the first position, the output 21 is connected directly to an input 26, to which the electrical grid system 9 can be connected. This switch position represents normal operation of the wind energy installation 1 on a sound electrical grid system 9. In the second switch position, the output 21 is connected to an electrical disturbance component 3. This is designed to produce a disturbed voltage U* from the voltage $U_N$ provided by the public grid system 9, which disturbed voltage U* is applied to the wind energy installation 1 in the event of a disturbance. The disturbed voltage U* differs from the voltage $U_N$ of the electrical grid system 9, and in particular it may be higher in order to simulate an overvoltage situation. The time and the time duration of the (simulated) grid system voltage disturbance that is applied to the wind energy installation 1 can be defined by controlled operation of the two switches 23, 24. The severity of the voltage disturbance can be controlled by adjustment of the voltage of the disturbance component 3. This embodiment of the test device offers the advantage that it allows the wind energy installation 1 to be tested directly on the public electrical grid system 9, and the disturbed voltage which is required for testing can be produced autonomously, by means of the electrical disturbance component 3, with little additional complexity. This embodiment therefore offers advantages in terms of simpler handling. The invention will be explained in more detail with reference to this embodiment, by way of example.

Figure 2:
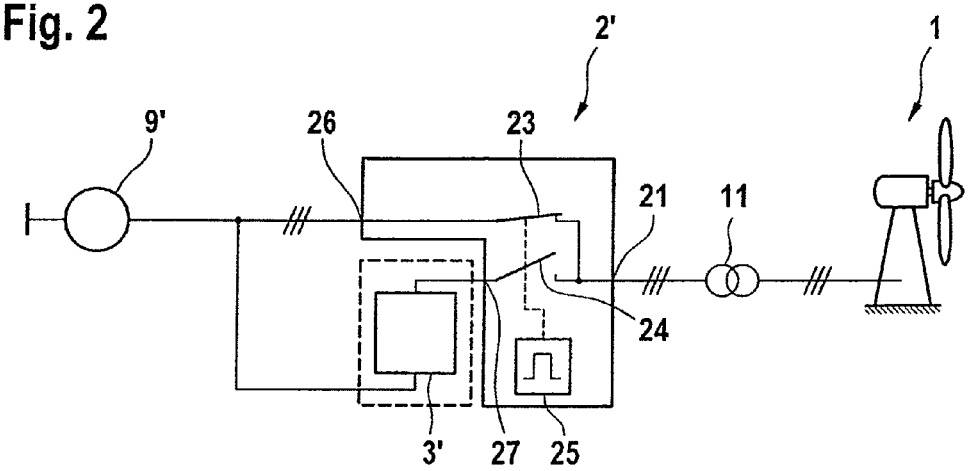
FIG. 2 shows a schematic view of a second embodiment of a test device.

A second, alternative embodiment, which is illustrated in FIG. 2, differs from that illustrated in FIG. 1 essentially in that the disturbance component 3' is in the form of a separate module. For this purpose, a second input 27 is passed out of the test device 2' and is intended for connection to the public grid system, which is replaced here by a voltage source 9' provided for simulation purposes. The test device 2' differs from the test device 2 essentially in that the electrical disturbance component 3' is no longer the test device 2' in integrated form, but is modularized. This offers the possibility of providing different electrical disturbance components 3', which are connected to the test device 2' as a module, depending on the application.

Figure 3:
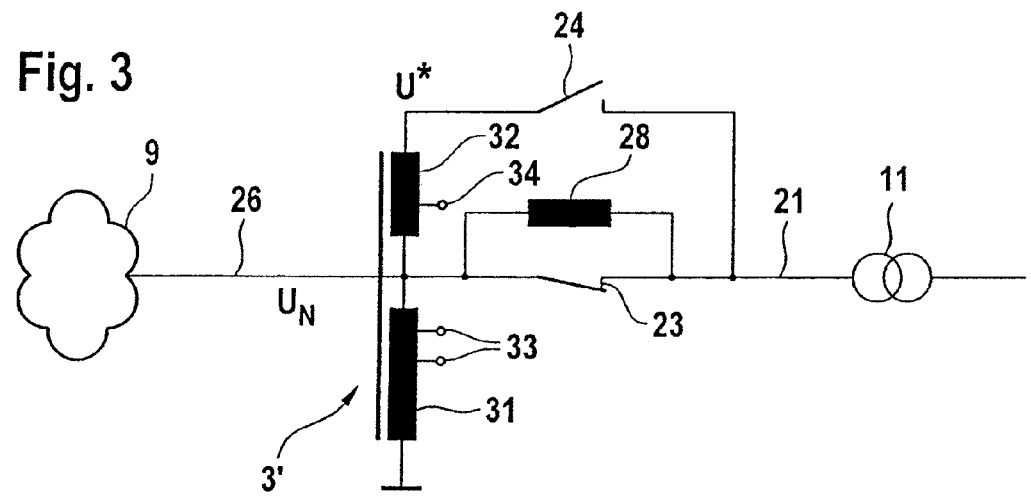
FIG. 3 shows a circuit example for the first embodiment of a test device.
Figure 4:
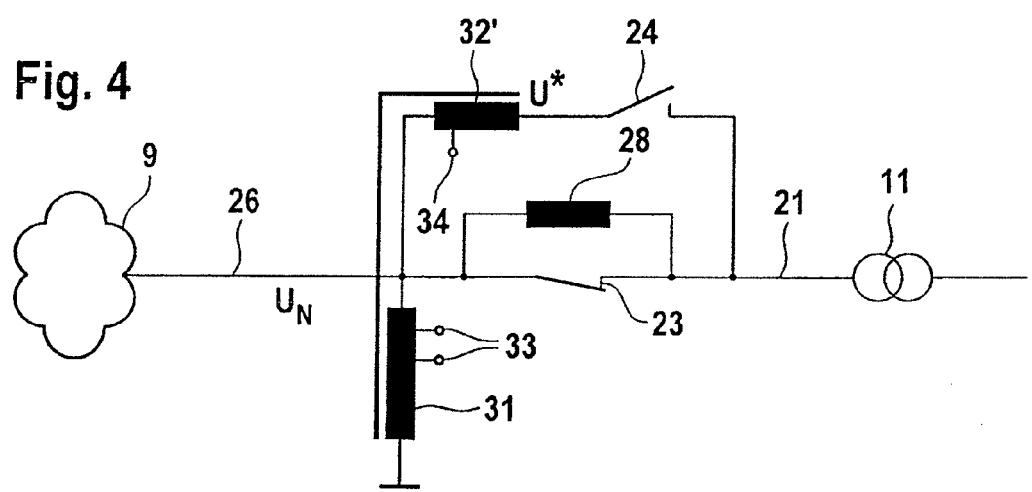
FIG. 4 shows a further circuit example of the first embodiment of a test device.

FIGS. 3 and 4 show two different circuit examples for the embodiment of the test device 2. For simplicity reasons, the switching module 25 for the two switches 23, 24 is not illustrated. A wind energy installation (not illustrated) is connected to the output 21 via the trans-former 11 in each case. The public electrical grid system 9 is connected to the input 26. The first switch 23 can once again be seen, which, in normal operation, connects the wind energy installation via the transformer 11 directly to the electrical grid system 9. The second switch 24 can also be seen which, when the first switch 23 is open, applies a disturbed voltage to the wind energy installation 1 with respect to the transformer 11. In addition, an inductor 28 is provided, and is connected in parallel with the first switch 23. This acts as a switching aid for bridging switching pauses which unavoidably occur during switching of the two switches 23, 24. This is because, in order to avoid a short between the normal voltage and the disturbed voltage, the sequence of the switching points of the two switches 23, 24 must be chosen such that they do not intersect, but such that they result in an at least minimal pause during which both switches are open. The inductor 28 is provided in order to create defined states of the output 21 even during these switching pauses. It should be noted that the inductor 28 may be a simple inductance (as illustrated), or a transformer with a shorted secondary can be used instead of this. The latter offers the advantage of better tolerance to current surges, which may be several times the rated current and cause considerable thermal and magnetic loads. Magnetic overloading in particular can be coped with better by a transformer connected as an inductor than by a simple inductance.

In this circuit arrangement, the electrical disturbance component 3 consists of an autotransformer with a primary winding 31 and a secondary winding 32. The primary winding 31 is connected by one connection (foot point) to a star point, which can be grounded, and the input 26 for connection of the (sound) public electrical grid system 9 is connected to the other connection. The switch 24 is in turn connected to the connection of the secondary winding 32. The autotransformer operates as an electrical disturbance component 3, as follows. During normal operation, the switch 24 is open and the switch 23 is closed. The voltage applied to the connection of the primary winding 31 from the public grid system 9 is connected directly via the transformer 11 to the wind energy installation 1. When the switches 23, 24 are operated, then the switch 23 is open first of all, as a result of which the current flows via the inductor 28 (which generally result in a sudden phase change in this case), until the switch 24 finally then closes. The voltage applied to the input 26 from the grid system 9 is now no longer passed on 1:1, but is increased by the ratio of the numbers of turns between the primary winding 31 and the secondary winding 32, as a result of which an overvoltage is finally applied via the transformer 11 to the wind energy installation 1. Switching back takes place in the opposite sequence, with the switch 24 being opened first of all and the switch 23 being closed after the switching pause has elapsed. It is therefore possible to test whether the wind energy installation 1 can withstand an overvoltage.

FIG. 4 shows a further circuit arrangement which differs from that illustrated in FIG. 3 essentially in that the autotransformer for the electrical disturbance component 3' is in the form of an autotransformer/phase-displacement transformer. This means that the secondary winding 32' is additionally in the form of a phase-displacement winding, that is to say it shifts the phase of the voltage connected to it. The invention has identified that, in practise, sudden voltage changes in the grid system generally affect not only the level of the voltage but also its phase. With this circuit arrangement, the invention offers the advantage that this can be taken into account by the special embodiment of the autotransformer/phase-displacement transformer with the integrated phase-displacement winding 32'. This increases the range of application of the test device according to the invention equipped in this way.

It should be noted that the secondary winding 32 and 32' can preferably be provided with intermediate taps 34. Since the second switch 24 is connected to one of these taps 34, the overvoltage level and the displacement angle level can be selected. A corresponding situation applies to the primary winding 31, which can likewise be provided with a plurality of taps 33, to which the input 26 can then be selectively connected.

Figure 5:
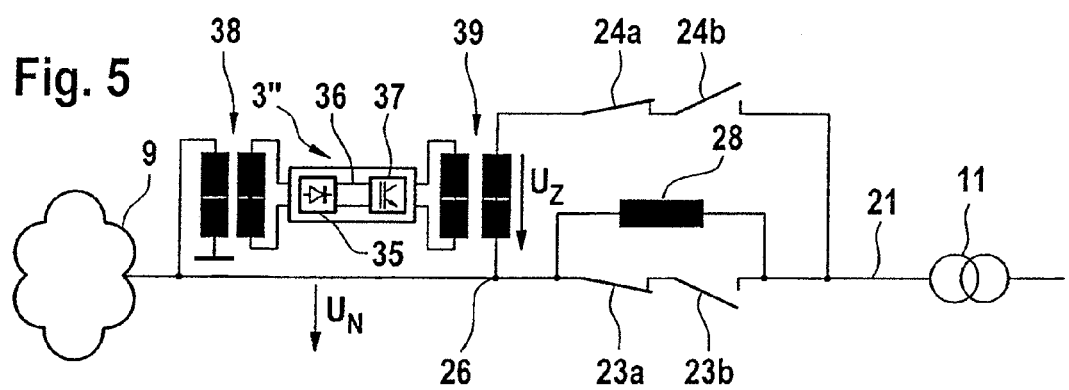
FIG. 5 shows another circuit example of the second embodiment of a test device.

FIG. 5 illustrates an alternative circuit variant, in which a converter 3" is provided instead of the phase-displacement transformer as the electrical disturbance component. This comprises an active rectifier 35, an intermediate circuit 36 and an inverter 37. The rectifier 35 can be connected to the public grid system 9, but can also be supplied with electrical power in some other way. The inverter 37 produces an additional voltage $U_z$, which is added to the voltage $U_N$ of the public grid system 9, and is applied to the second switch 24. The rectifier 35 and the inverter 37 are connected via coupling transformers 38, 39, for isolation of the medium-voltage potential. When, as described above, the first and the second switches 23, 24 are operated, then an excessive voltage is applied to the wind energy installation 1 via the transformer 11 when the second switch 24 is closed. Corresponding operation of the inverter 37 also allows the polarity of the voltage $U_z$ to be reversed, resulting in an undervoltage in the switch 24. The response of the wind energy installation to an undervoltage can therefore also be tested. The switches 23, 24 are in the form of double switches 23a, b and 24a, b. This allows very short switching times to be achieved, in order in this way to also simulate brief voltage peaks and dips (transients). These double switches can also be provided in the embodiments shown in FIGS. 3 and 4. It should be noted that the application of the disturbance component can also be controlled directly from the inverter 37, without switches 23, 24, via rapid regulation at the inverter 37.

Figure 6A:
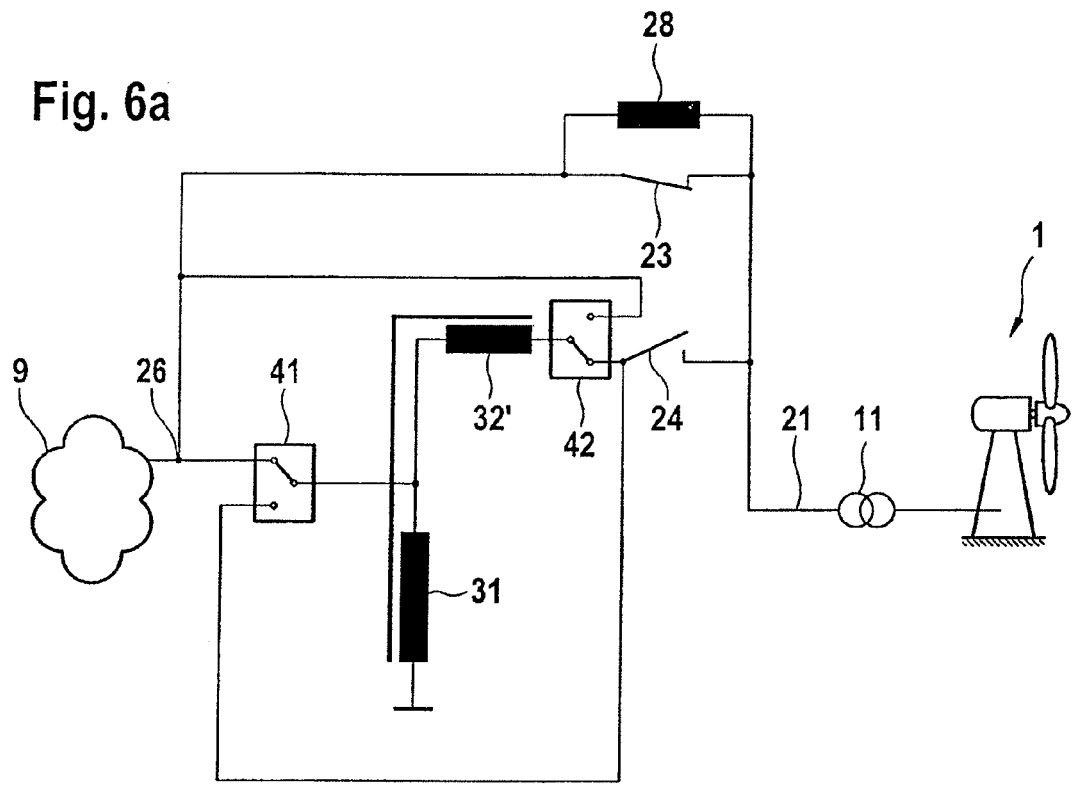
FIGS. 6a, b show circuit examples for the first embodiment of the test device with a multi-switching unit.
Figure 6B:
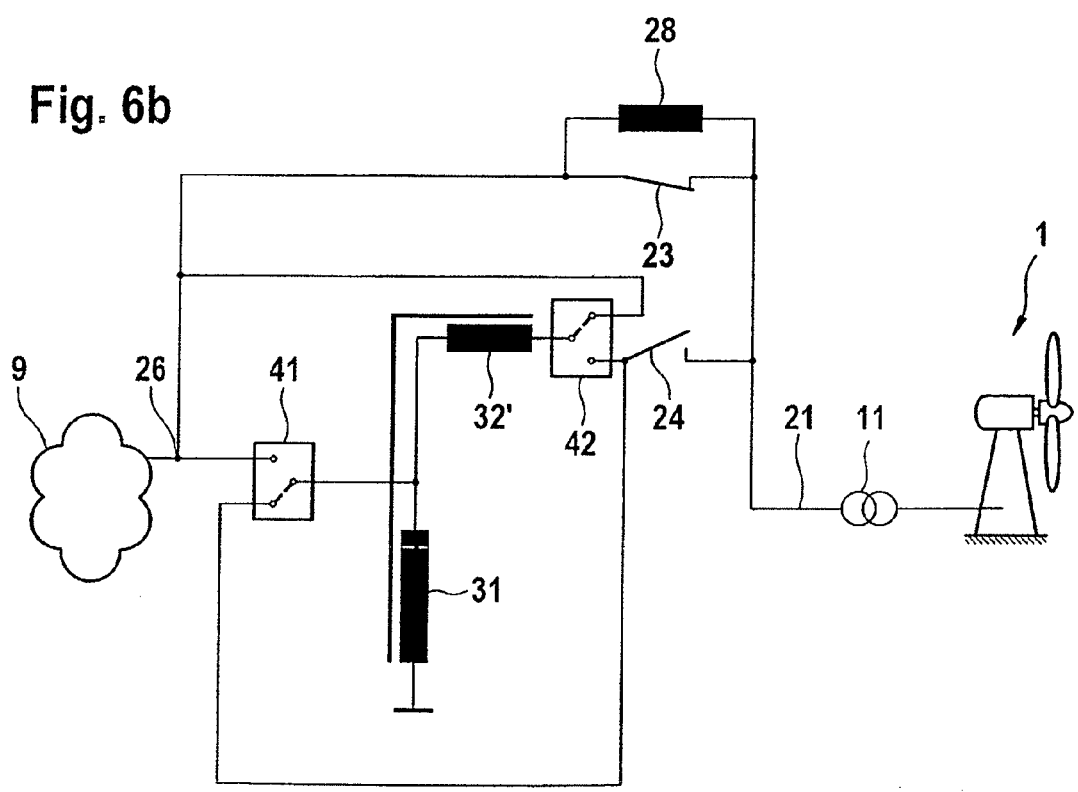

FIG. 6 shows a further circuit arrangement which can be used selectively to produce overvoltage or undervoltage. This is based on the circuit variant shown in FIG. 4. A multi-switching unit 4 is additionally provided, and comprises two changeover switches 41, 42, which selectively connect the input 26 to the connection of the primary winding 31 or of the secondary winding 32, or the second switch 24 to the connection of the secondary winding 32 or of the primary winding 31. When the multi-switching unit 4 is in its rest position, as is illustrated in FIG. 6a, then this results in a circuit arrangement corresponding to that shown in FIG. 4. When the first and the second switches 23, 24 are operated, the wind energy installation 1 therefore has an overvoltage applied to it. In contrast, when the switching system is in the second position, as illustrated in FIG. 6b, a circuit arrangement is thus formed in which the autotransformer/phase-displacement transformer is now switched in order to step down the voltage, and a voltage which is lower than the voltage of the input 26 is applied to the second switch 24. An undervoltage is therefore applied to the wind energy installation 1 by operation of the switches 23, 24. This switching system allows the test device according to the invention, in combination with the autotransformer provided according to the invention, to carry out both undervoltage and overvoltage testing, in a surprisingly simple manner.

Figure 7:
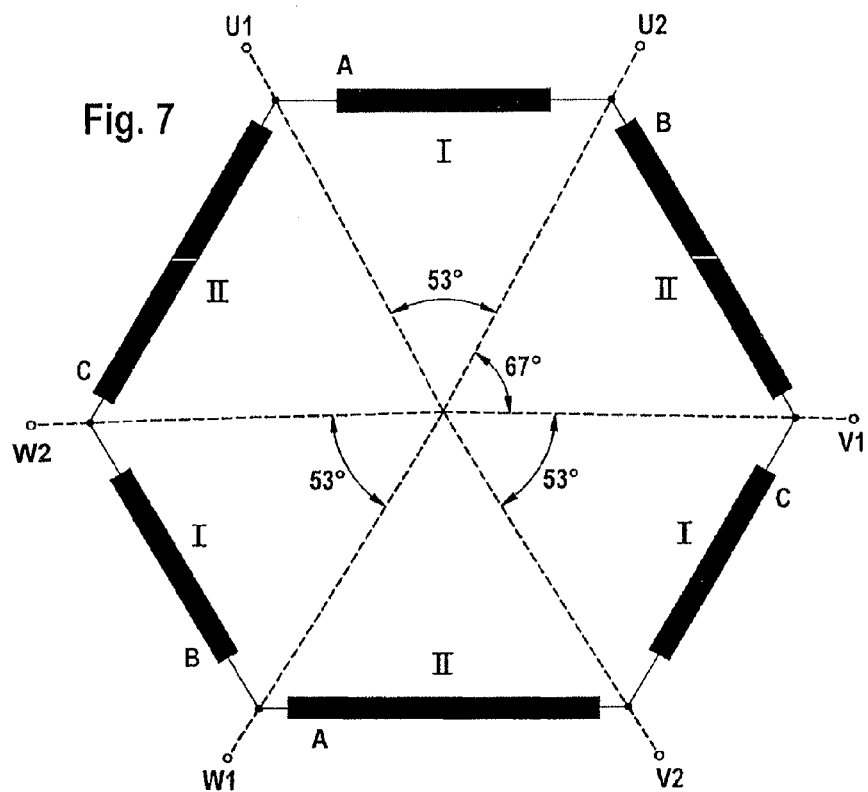
FIG. 7 shows a transformer for the second circuit example.

FIG. 7 illustrates one technical exemplary embodiment of a corresponding autotransformer/phase-displacement transformer for polyphase applications. The figure shows six windings, which are in the form of alternatively arranged windings of a first type I and of a second type II. The transformer is designed such that the output voltage produced at the output terminals U1, V1, W1, for example of 20 kV, is of precisely the same magnitude as the input voltage of 20 kV applied to the input terminals U2, V2, W2. In the illustrated exemplary embodiment, the transformer is designed for a phase-displacement angle of 53°. By use of the "cosine rule" with the winding section voltage as one limb of an equilateral triangle, this results in the winding voltage of the winding of the first type I being defined by the formula:

$$U_I = \frac{20 \text{kV}}{\sqrt{3} \times \sqrt{2 \times (1 - \cos 53°)}}$$

resulting in a value of 10.3 kV. The winding voltage of the windings of the second type II is correspondingly defined by:

$$U_{II} = \frac{20 \text{kV}}{\sqrt{3} \times \sqrt{2 \times (1 - \cos 67°)}}$$

resulting in a value of 12.75 kV.

The limbs of the transformer are each formed by two mutually opposite windings, that is to say in FIG. 7, by way of example, by the upper winding of type I and by the lower winding of type II for the first limb, etc. The ratio of the voltages $U_I$ and $U_{II}$ therefore directly represents the ratio of the numbers of turns on the primary and secondary windings in the autotransformer/phase-displacement transformer.

Figure 8:
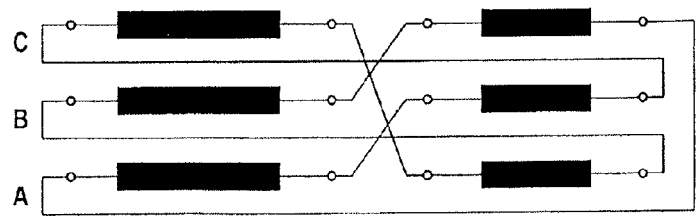
FIG. 8 shows a circuit for the transformer shown in FIG. 7.

FIG. 8 illustrates one example of the connection wiring for the individual windings of the autotransformer/phase-displacement transformer. The voltages at the input and output connections are in this case of the same magnitude, but have been shifted through a phase angle of 53° with respect to one another. It should be noted that the output and input can be interchanged with one another, thus allowing the phase angle to be shifted, that is to say resulting in −53°. Any desired phase-displacement angles and transformation ratios for the voltages can be achieved by adaptation of the numbers of turns. If one or more taps are provided on the windings, then different phase-displacement angles and, if required, also different voltage transformation ratios can be achieved, using only one transformer.

The invention claimed is:

1. A wind energy installation test device for defined production of grid system faults, comprising:
   an output configured to connect to a wind energy installation;
   an input configured to connect to a grid system; and
   a switching device for connection of an electrical disturbance component relating to a grid system parameter,
   wherein an autotransformer having a phase-displacement winding is used for the electrical disturbance component, the grid system in a sound state being connected to a connection of a primary winding and the grid system in a disturbed state with respect to the grid system parameter being output at a connection of a secondary winding, wherein the autotransformer uses portions of the same winding for both the primary winding and the secondary winding.

2. The wind energy installation test device of claim 1, wherein the phase-displacement winding is additional to the primary winding and the secondary winding.

3. The wind energy installation test device of claim 2, wherein the phase-displacement winding is configured to be switchable.

4. The wind energy installation test device-of claim 2, wherein the phase-displacement winding is provided with a plurality of taps.

5. The wind energy installation test device of claim 2, wherein the phase-displacement winding is configured to produce an electrical angle between the phases of 50° to 60°.

6. The wind energy installation test device of claim 2, wherein the phase-displacement winding is configured to produce an electrical angle of 53°.

7. The wind energy installation test device of claim 1, wherein at least one of the primary winding and the secondary winding is provided with a plurality of taps.

8. The wind energy installation test device of claim 1, wherein the autotransformer comprises an autotransformer/phase-displacement transformer having an integrated phase-displacement winding.

9. The wind energy installation test device of claim 1, wherein the switching device comprises double switches which are connected in series in order to produce short switching times.

10. The wind energy installation test device of claim 1, wherein the switching device comprises electronic switches.

11. The wind energy installation test device of claim 1, further comprising a multi-switching unit configured to switch the electrical disturbance component between an overvoltage and an undervoltage operating mode.

12. The wind energy installation test device of claim 1, wherein the autotransformer comprises a plurality of parallel transformers which can be activated individually.

13. A method for testing a wind energy installation, comprising:
   (a) connecting an autotransformer having a phase-displacement winding with the connection between a distribution grid system and a wind energy installation, the connection having a first transformation ratio;
   (b) switching the autotransformer to a different transformation ratio with a higher secondary voltage for a predefined time; and
   (c) switching the autotransformer back to the first transformation ratio.

14. The method of claim 13, wherein step (b) is carried out with at least one of different transformation ratios and different transformers.

15. The method of claim 13, wherein step (b) is carried out with different phase-displacement angles.

16. The method of claim 13, wherein the autotransformer is connected in series with the connection between the distribution grid system and the wind energy installation.

17. The method of claim 13, wherein the autotransformer is connected in parallel with the connection between the distribution grid system and the wind energy installation.

18. The method of claim 13, wherein the first transformation ratio is 1:1.

* * * * *